(12) United States Patent
Quoirin et al.

(10) Patent No.: US 8,384,154 B2
(45) Date of Patent: Feb. 26, 2013

(54) BIDIRECTIONAL POWER SWITCH CONTROLLABLE TO BE TURNED ON AND OFF

(75) Inventors: Jean-Baptiste Quoirin, Tours (FR); Luong Viêt Phung, Saint Cyr sur Loire (FR); Nathalie Batut, Hommes (FR)

(73) Assignees: STMicroelectronics (Tours) SAS, Tours (FR); Universite Francois Rabelais UFR Sciences et Techniques, Tours Cedex 1 (FR)

( * ) Notice: Subject to any disclaimer, the term of this patent is extended or adjusted under 35 U.S.C. 154(b) by 243 days.

(21) Appl. No.: 12/951,192

(22) Filed: Nov. 22, 2010

(65) Prior Publication Data

US 2011/0121407 A1 May 26, 2011

(30) Foreign Application Priority Data

Nov. 24, 2009 (FR) ...................... 09 58310

(51) Int. Cl.
*H01L 29/66* (2006.01)
(52) U.S. Cl. ........ 257/343; 257/370; 257/378; 257/526; 257/575; 257/E29.114; 257/E29.124; 257/E29.171; 257/E21.696
(58) Field of Classification Search .................. None
See application file for complete search history.

(56) References Cited

U.S. PATENT DOCUMENTS

| | | | |
|---|---|---|---|
| 6,972,466 B1 * | 12/2005 | Liang et al. | 257/370 |
| 7,285,484 B2 * | 10/2007 | Suzuki | 438/585 |
| 2010/0065885 A1 | 3/2010 | Ludikhuize | |
| 2010/0295157 A1 * | 11/2010 | Chao | 257/565 |

OTHER PUBLICATIONS

French Search Report dated May 28, 2010 from corresponding French Application No. 09/58310.
Cao G J et al, *Resurfed Lateral Bipolar Transistors for High-Voltage, High-Frequency Applications* 12th. International Symposium on Power Semiconductor Devices and IC's, Proceedings. Toulouse, France, May 22-25, 2000; New York, NY :IEEE, May 22, 2000, pp. 185-187, XP000987856.
Faranak Homayoni et al: "*A High Gain Lateral BJT on Thin Film Silicon Substrate*", Electron Devices and Solid-State Circuits, 2009. EDSSC 2009. IEEE International Conference of, IEEE, Piscataway, NJ, USA Jan. 25, 2009, pp. 278-281, XP031616041.
Sajad a Loan et al: *A Novel High Breakdown Voltage Lateral Bipolar Transistor on SOI with Multizone Doping and Multistep Oxide; A Novel High Breakdown Voltage Lateral Bipolar Transistor on SOI* Semiconductor Science and Technology, IOP Publishing Ltd., GB, vol. 24, No. 2, Feb. 1, 2009, p. 25017, XP020150834.

* cited by examiner

*Primary Examiner* — Alonzo Chambliss
(74) *Attorney, Agent, or Firm* — Wolf, Greenfield & Sacks, P.C.

(57) ABSTRACT

A bidirectional power transistor formed horizontally in a semiconductor layer disposed on a heavily-doped semiconductor wafer with an interposed insulating layer, the wafer being capable of being biased to a reference voltage, the product of the average dopant concentration and of the thickness of the semiconductor layer ranging between $5 \cdot 10^{11}$ cm$^{-2}$ and $5 \cdot 10^{12}$ cm$^{-2}$.

10 Claims, 3 Drawing Sheets

BIDIRECTIONAL POWER SWITCH CONTROLLABLE TO BE TURNED ON AND OFF

CROSS REFERENCE TO RELATED APPLICATIONS

This application claims the priority benefit of French patent application No. 09/58310, filed on Nov. 24, 2009, entitled "BIDIRECTIONAL POWER SWITCH CONTROLLABLE TO BE TURNED ON AND OFF," which is hereby incorporated by reference to the maximum extent allowable by law.

BACKGROUND OF THE INVENTION

1. Field of the Invention

The present invention relates to a monolithic bidirectional power switch controllable on and off.

2. Discussion of the Related Art

The term "power switch" is here used to designate a switch capable of switching at voltages greater than 100 volts and/or at currents greater than 1 ampere. A power switch is for example intended to switch the power supply of a load connected to the mains. A power switch is generally formed vertically in a semiconductor substrate, that is, the current between the main electrodes of the switch flows between the upper and lower surfaces of the semiconductor substrate. This differentiates power switches from the components of an integrated circuit, which are generally horizontal, that is, the main electrodes of these components are located on a same surface of the semiconductor substrate and the current flows horizontally between these main electrodes.

An on and off controllable device, such as a vertical MOS transistor, may be used as a power switch. However, a vertical MOS transistor is unidirectional and it is necessary to associate it with a diode bridge if an A.C. current is desired to be conducted. This association has the disadvantage of having a non-negligible voltage drop in the on state. This is also true for a bipolar transistor.

A bidirectional component such as a triac, which has the advantage of having a very small voltage drop in the on state, may also be used. However, this component has the disadvantage of not being controllable to be turned off, unless a complex control circuit is associated thereto.

FIG. 1 shows a vertical bipolar NPN-type power transistor. At the surface of a lightly-doped N-type (N⁻) semiconductor substrate 1 is formed a heavily-doped N-type (N⁺) region 3 in a P-type well 5. Substrate 1 and region 3 respectively form the collector and the emitter of the transistor. Well 5 forms the transistor base. On the lower surface of substrate 1 is formed a heavily-doped collector contact N-type layer 7. Respective emitter, base, and collector metallizations E, B, and C are formed on regions 3, 5, and 7.

Substrate 1 is relatively thick, which provides a significant off-state breakdown voltage. Indeed, intrinsic silicon can withstand approximately 10 V per micrometer of silicon. Thus, a vertical structure comprising a substrate 1 having a thickness on the order of 60 μm may withstand, in the off state, a voltage on the order of 600 V.

If a power transistor with a bidirectional operation is desired to be obtained, it can be envisaged to make the structure of FIG. 1 symmetrical, for example, as illustrated in FIG. 2.

The structure of FIG. 2 comprises a stack of a first thick lightly-doped N-type semiconductor layer 11, of a thin lightly-doped P-type layer 13, and of a second thick lightly-doped N-type layer 15. Layer 13 forms the base of the symmetrical transistor and layers 11 and 15 form its emitter/collector regions. Heavily-doped N-type emitter/collector contact regions 17 and 19 are formed, respectively, on the upper surface of layer 15 and on the lower surface of layer 11. A heavily-doped P-type (P⁺) well 21 crosses semiconductor layers 15 and/or 11 and contacts base region 13. Respective emitter/collector and base metallizations A1, A2, and B are respectively formed on regions 17, 19, and 21.

The symmetrical structure of FIG. 2, however, cannot operate properly. Indeed, emitter/collector regions 15 and 11 are lightly N-type doped, which makes them efficient as collector regions (high breakdown voltage) but inappropriate as emitter regions, since they do not enable a proper injection of carriers in the on state. Thus, in both operating directions, the structure of FIG. 2 has a low gain. To improve the on-state carrier injection, the doping of regions 15 and 11 should be increased, but this would decrease the breakdown voltage. Further, it is difficult to form a thin deeply buried base region 13 with current techniques, and the forming of a well 21 poses problems and may have side effects.

A bidirectional switch, controllable to be turned on and off, is thus needed.

SUMMARY OF THE INVENTION

An object of an embodiment of the present invention is to overcome at least some of the disadvantages of existing bidirectional power switches, controllable to be turned on and off.

Another object of an embodiment of the present invention is to provide a bidirectional power transistor having, in the on state, a high gain.

Another object of an embodiment of the present invention is to provide such a transistor having, when off, a high breakdown voltage.

Thus, an embodiment of the present invention provides a symmetrical power transistor formed horizontally in a semiconductor layer laid on a heavily-doped semiconductor wafer with an interposed insulating layer, the wafer being capable of being biased to a reference voltage, the product of the average dopant concentration and of the thickness of the semiconductor layer ranging between $5 \cdot 10^{11}$ cm$^{-2}$ and $5 \cdot 10^{12}$ cm$^{-2}$.

According to an embodiment of the present invention, the product of the average dopant concentration and of the thickness of the semiconductor layer ranges between $9 \cdot 10^{11}$ and $2 \cdot 10^{12}$ cm$^{-2}$.

According to an embodiment of the present invention, the transistor comprises, in the semiconductor layer:

a lightly-doped semiconductor strip of a first conductivity type, at a doping level smaller than $5 \cdot 10^{15}$ at./cm$^3$; and two doped regions of a second conductivity type at a doping level ranging between $10^{15}$ and $8 \cdot 10^{17}$ at./cm$^3$, located symmetrically with respect to the semiconductor strip.

According to an embodiment of the present invention, the doping level of each of the doped regions of the second conductivity type increases from the semiconductor strip.

According to an embodiment of the present invention, the doping of the doped regions of the second conductivity type gradually varies within a range having its lower limit between $10^{15}$ and $5 \cdot 10^{15}$ at./cm$^3$ and having its upper limit between $5 \cdot 10^{16}$ and $8 \cdot 10^{17}$ at./cm$^3$.

According to an embodiment of the present invention, the transistor further comprises heavily-doped fingers of the first conductivity type crossing the semiconductor strip and extending on either side of the strip in the doped regions of the second conductivity type.

According to an embodiment of the present invention, the semiconductor strip has a width smaller than 2 μm.

According to an embodiment of the present invention, the transistor further comprises a second insulating layer formed on the semiconductor layer and topped with a second conductive layer connected to the semiconductor strip.

According to an embodiment of the present invention, the transistor is of interdigited type.

According to an embodiment of the present invention, the transistor is of bipolar type, the lightly-doped strip of the first conductivity type forming a base and the doped regions of the second conductivity type forming emitter/collector regions.

According to an embodiment of the present invention, the transistor is of MOS type, the doped regions of the second conductivity type forming drain/source regions, the transistor further comprising an insulated gate formed on the lightly-doped semiconductor strip of the first conductivity type.

The foregoing objects, features, and advantages of the present invention will be discussed in detail in the following non-limiting description of specific embodiments in connection with the accompanying drawings.

DETAILED DESCRIPTION

Figure 1:
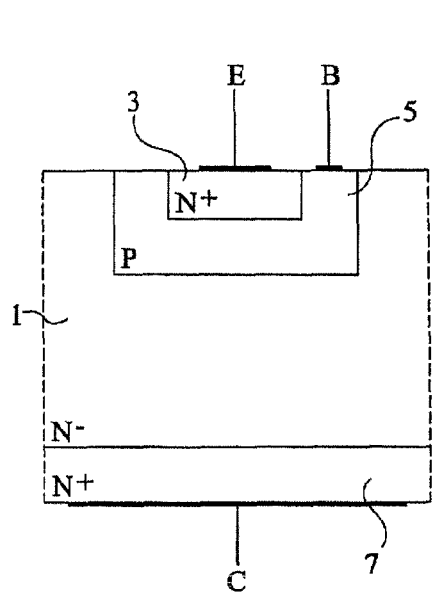
FIG. 1, previously described, illustrates a known vertical power transistor.
Figure 2:
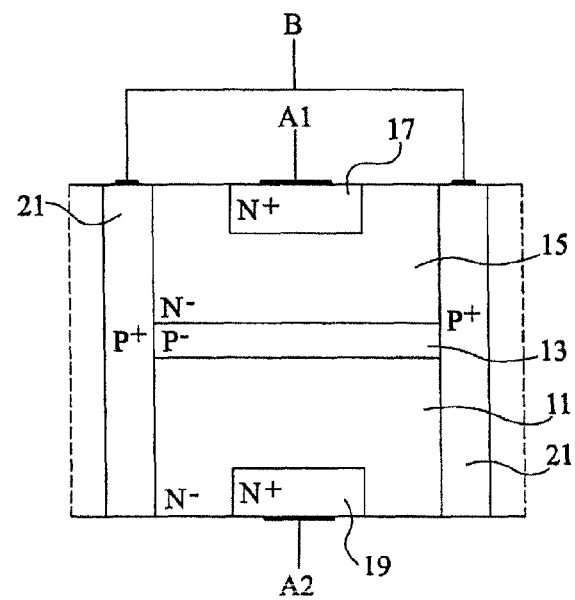
FIG. 2, previously described, illustrates a symmetrical vertical power transistor.

For clarity, the same elements have been designated with the same reference numerals in the different drawings and, further, as usual in the representation of integrated circuits, the various drawings are not to scale.

Figure 3:
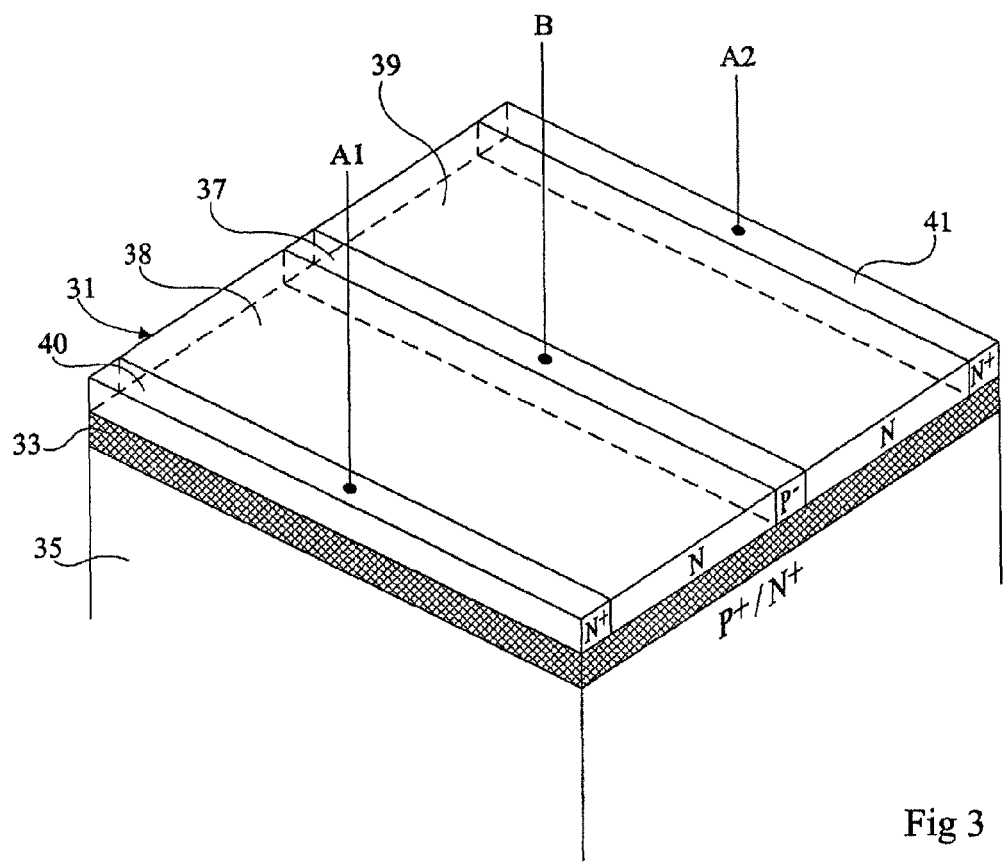
FIG. 3 is a perspective view of a bidirectional power transistor according to an embodiment of the present invention.

FIG. 3 is a perspective view of a bidirectional transistor according to an embodiment of the present invention. Unlike known power transistors, which are generally vertical, the transistor of FIG. 3 is horizontal. This enables to do away with the issues of the forming of deep thin bases of the vertical symmetrical transistors and of the problems caused by the presence of wells of access to these bases.

The transistor is formed in a semiconductor layer 31 which extends on an insulating layer 33, insulating layer 33 extending on a heavily-doped semiconductor wafer 35 biased to a reference voltage. In the shown example, the transistor is an NPN transistor. It should be noted that a PNP transistor can be manufactured in the same way, by inverting all conductivity types. As an example, insulating layer 33 may be made of silicon oxide. It should also be noted that insulating walls (not shown), crossing silicon layer 31 and reaching insulating layer 33, may be formed all around the transistor of FIG. 3.

Semiconductor layer 31 is N-type doped. At the center of semiconductor layer 31 is formed a lightly-doped P-type strip 37 (P⁻) which crosses layer 31 and separates it in two portions 38 and 39. Portion 38 forms the emitter, respectively the collector, of the transistor, and portion 39 forms its collector, respectively its emitter. Strip 37 forms the transistor base and a metallization B is formed at the surface of strip 37. On either side of strip 37, at the opposite ends of portions 38 and 39, heavily-doped N-type strips (N⁺) forming emitter/collector contact region 40 and collector/emitter contact region 41 on which are formed metallizations A1 and A2 are formed symmetrically.

The fact for the transistor to be of horizontal type provides a direct access to base 37. Further, as thin a baseband 37 as desired may be formed. As an example of numerical values, strip 37 may have a width smaller than 2 μm.

The transistor of FIG. 3 is bidirectional and can thus be used as a controllable switch intended to conduct an A.C. current, for example, intended to be connected to the mains. Indeed, it will be shown that, for a selected doping of semiconductor layer 31, provided to optimize the thickness of this layer, when the transistor is off, the transistor portion corresponding to its collector region is depleted.

More specifically, a doping level (n) for semiconductor layer 31, which enables a satisfactory injection for the portion of this layer operating as an emitter is selected, and the thickness ($t_{SOI}$) of this layer is determined so that:

$$n \cdot t_{SOI} \# \in_s \cdot E_{cr}/q \# 10^{12} \text{ cm}^{-2}$$

where $\in_s$ is the dielectric permittivity of semiconductor layer 31, $E_{cr}$ is the critical field of semiconductor layer 31, and q is the charge of the electron.

In other words, the thickness ($t_{SOI}$) of semiconductor layer 31 is selected according to the doping level (n) of this layer as follows:

$$t_{SOI} \# 10^{12}/n \text{ cm},$$

preferably $$5 \cdot 10^{11}/n < t_{SOI} < 5 \cdot 10^{12}/n \text{ cm}.$$

Under such doping and thickness conditions, when heavily-doped N-type or P-type semiconductor wafer 35 is biased to a reference voltage and when the transistor formed in semiconductor layer 31 is in the off state, a so-called resurf effect (for REduced SURface Field) occurs, which results in that the semiconductor layer portion biased as an open collector fully depletes and thus acquires an apparent doping level much lower than its real doping level.

Figure 4:
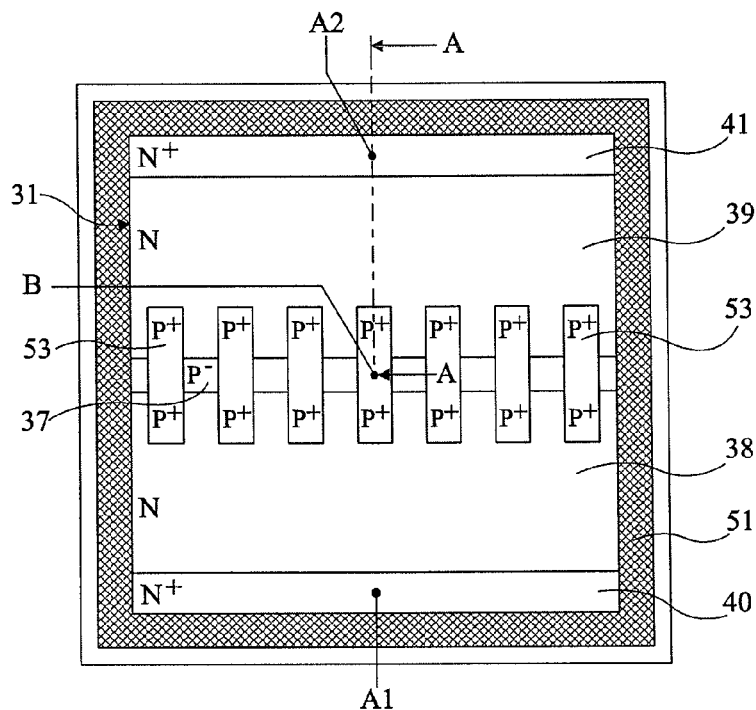
FIG. 4 is a top view of a variation of a transistor according to an embodiment of the present invention.

FIG. 4 is a top view of a variation of a transistor according to an embodiment of the present invention. It shows lightly-doped N-type emitter/collector regions 38, 39 located symmetrically with respect to strip-shaped base region 37. Heavily-doped N-type emitter/collector contact regions 40, 41 are arranged on either side of emitter/collector regions 38, 39. A wall of insulating material 51 crossing semiconductor layer 31 surrounds the transistor. In this variation, heavily-doped P-type fingers 53 cross strip 37 and extend, perpendicularly to strip 37, on either side thereof. Fingers 53 extend in emitter/collector regions 38, 39 along a length which will be selected appropriately according to the distance between fingers 53. There are many fingers 53, which enable to protect base 37, which is relatively thin, in the off state. Indeed, in this state, the presence of heavily-doped fingers 53 enables forming two opposite electric space charge areas between each finger 53 in the vicinity of base 37. Such electric fields compensate for each other, which enables to generate, around base 37, an area with no electric field. A breakdown in the vicinity of the base is thus avoided.

Figure 5:
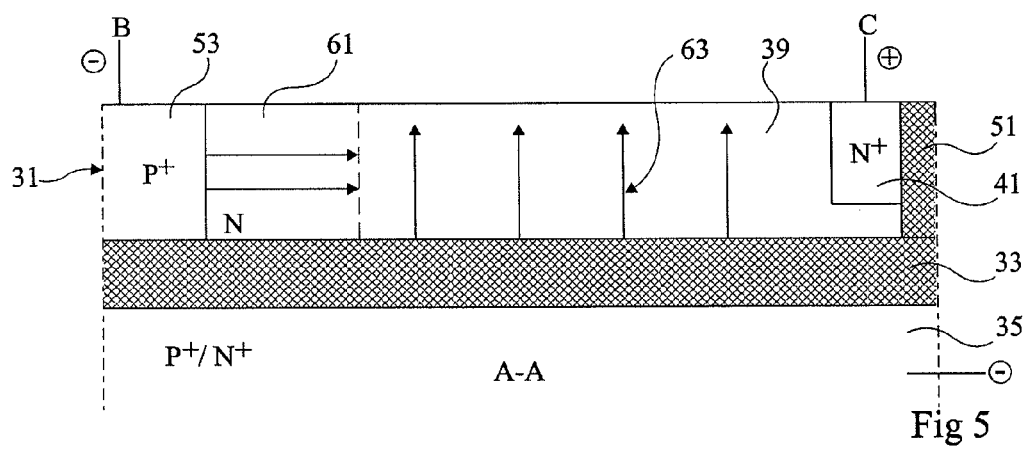
FIG. 5 is a cross-section view illustrating an effect advantageously obtained with a transistor according to an embodiment of the present invention.

FIG. 5 is a cross-section view of one half of the transistor of FIG. 4 along cross-section line A-A of this drawing. More specifically, the transistor half on the collector side when it is biased in the open state has been shown. The above-mentioned resurf effect results in that, in addition to depleted region 61 close to the collector-base junction, a depleted region designated by arrows 63 forms, which extends all the way to the surface of collector region 39 if its thickness complies with the above-mentioned conditions. Thus, when the transistor is off, it can withstand a significant voltage between its base and its collector. The depletion of collector region 39 in the open state allows the doping of layer 31 to increase. This enables a significant carrier injection between the emitter and the base when the transistor is desired to be turned on. As an example, the doping of semiconductor layer 31 may range between $10^{15}$ and $8·10^{17}$ at./cm$^3$, and be preferably greater than $5·10^{15}$ at./cm$^3$.

Figure 6:
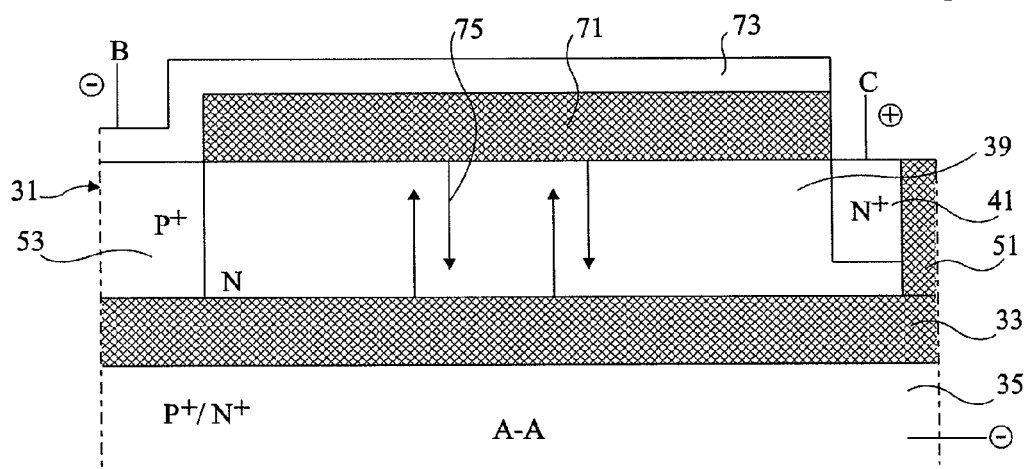
FIG. 6 is a cross-section view illustrating a variation of a transistor according to an embodiment of the present invention.

FIG. 6 illustrates a variation of the structure of FIG. 5. In addition to the elements of FIG. 5, an insulating layer 71 is formed above semiconductor layer 31 and is covered with a conductive layer 73, for example made of doped to semiconductor or metal, which contacts base region 37. Thus, when the transistor is turned off, that is, when the base is at the lowest voltage and the collector is at the highest voltage, a resurf effect also emanates from the upper surface of layer 31, due to the addition of insulating layer 71 and conductive layer 73, as indicated by arrows 75. Thus, a greater thickness of semiconductor layer 31 can be depleted, and thus a thicker layer 31 can be provided to enable the flowing of a greater current in the transistor, in the on state. Rather than increasing the thickness of layer 31, the doping of layer 31 may also be further increased to enable, in the on state, the flowing of a greater current.

The present inventors have examined the distribution of the equipotential lines in a device such as that in FIG. 4, in the off state, and they have found that these lines were concentrated around the collector region.

Figure 7A:
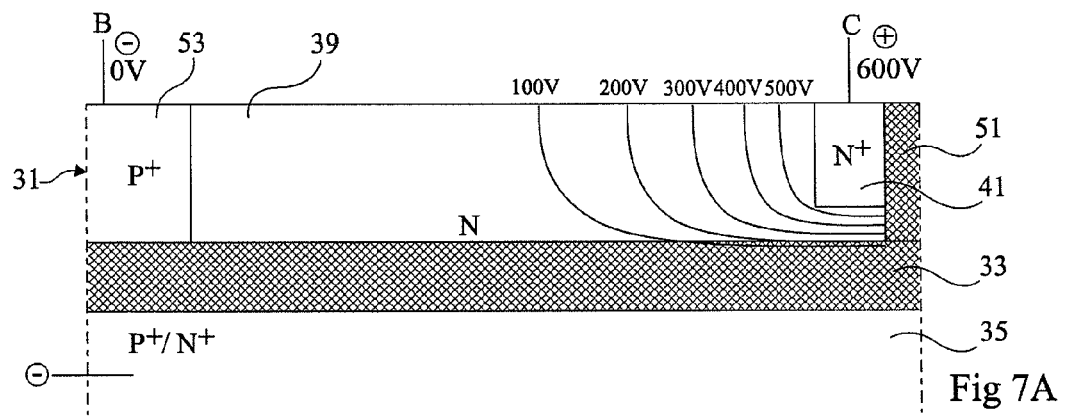
FIGS. 7A and 7B illustrate an advantage of a variation of a transistor according to an embodiment of the present invention.

FIG. 7A is a cross-section view along line A-A, which in this case illustrates an example of distribution of equipotential lines. It is here considered that the collector contact is connected to a 600-V voltage and that the base is connected to a 0-V voltage. The equipotential lines (500 V, 400 V . . . ) concentrate close to the collector contact. Thus, the first micrometers of collector region 39 located close to collector contact 41 needs to withstand almost all of the 600 V. This may cause a breakdown.

To solve this problem, the present inventors provide forming emitter/collector regions 38 and 39 having a gradual doping between the base region and the respective emitter and collector, contact regions.

Figure 7B:
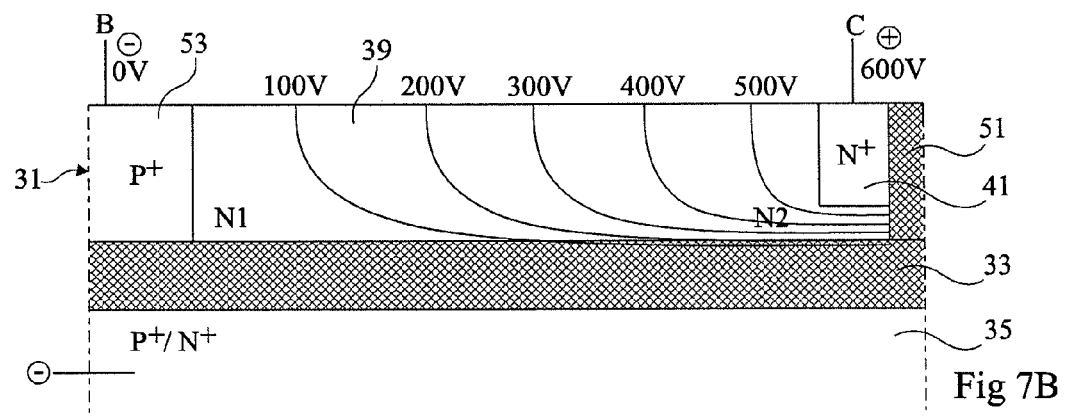

FIG. 7B illustrates the distribution of the equipotential lines in such a structure. In this drawing, the 600-V voltage between the base and collector contact 41 substantially distributes along the entire length of collector region 39. Thus, the risks of breakdown of this layer are limited. As an example of numerical values, the lowest doping (N1) of collector region 39, on the base side, may range between $10^{15}$ and $5·10^{15}$ at./cm$^3$, and for example be on the order of $5·10^{15}$ at./cm$^3$, and the highest doping (N2), on the side of collector contact 41, may range between $5·10^{16}$ and $8·10^{17}$ at./cm$^3$, and for example be on the order of $6·10^{17}$ at./cm$^3$ for a length between the base and the collector contact on the order of 35 µm and a semiconductor layer 31 having a thickness of approximately 1.5 µm.

Thus, a bidirectional transistor having, in the on state, a high gain and a low voltage drop due to the high progressive doping of respective emitter and collector regions 38 and 39 (up to $8·10^{17}$ at./cm$^3$), is obtained. In the off state, the transistor withstands high voltages since semiconductor layer 31 is fully depleted and that the equipotential lines between the base and collector contact regions are distributed along the entire length of the collector region.

As an example of numerical values, with a device having the following characteristics:

thickness of insulating layer 33: 3 µm;
thickness of insulating layer 71: 3 µm;
doping of baseband layer 37: $2.25·10^{15}$ at./cm$^3$
doping of fingers 53: $3·10^{19}$ at./cm$^3$
minimum and maximum dopings of semiconductor layer 31: N1=$5·10^{15}$ at./cm$^3$, N2=$6·10^{16}$ at./cm$^3$
thickness of semiconductor layer 31: 1.5 µm, a transistor having a gain on the order of 44, losses on the order of 2.58 W for a 5-A current, and requiring a substrate surface area of no more than approximately 1.5 cm$^2$ is obtained.

Further, the transistor described herein can be obtained by a simple conventional method.

Figure 8:
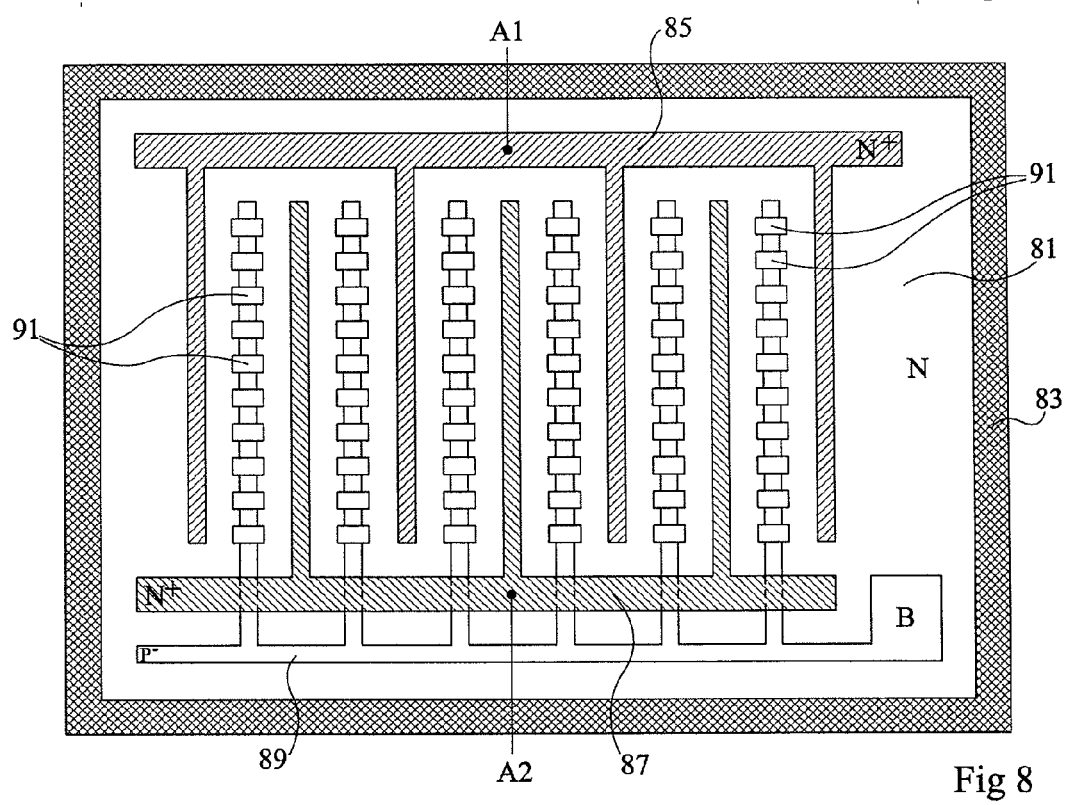
FIG. 8 illustrates an example of a transistor structure according to an embodiment of the present invention.

FIG. 8 is a top view of an embodiment of a power transistor having interdigited emitter, collector, and base regions.

An N-type doped semiconductor layer 81 extends on an insulating layer, not shown. An insulating wall 83 surrounds the transistor and crosses semiconductor layer 81. Respective heavily-doped N-type emitter/collector and collector/emitter contact regions 85 and 87 are formed in semiconductor layer 81. Regions 85 and 87 are formed of a main strip from which several thinner strips extend. The thinner strips of regions 85 and 87 are interdigited in layer 81. A lightly-doped P-type base region 89 (P$^-$) is also formed in semiconductor layer 81. Region 89 is also formed of a main strip from which thinner strips extend. Each thinner strip of base 89 is located, in semiconductor layer 81, between the thin strips of emitter and collector contact regions 85 and 87. Heavily-doped P-type fingers 91, similar to fingers 53 of FIG. 4, cross the thinner strips of base region 89 and extend on either side of these strips.

Semiconductor layer 81 may have a progressive doping between each of thin base strips 89 and each of thin emitter/collector strips 85 and 87, to promote the distribution of the field lines in semiconductor layer 81 when the transistor is off.

The interdigited structure of FIG. 8 enables to form, on a small substrate surface area, a transistor made of several transistors in parallel which have a high on-state gain. The breakdown voltage across the main terminals of the transistor in the off state may also be high.

Specific embodiments of the present invention have been described. Various alterations and modifications will occur to those skilled in the art. In particular, it should be noted that all the conductivity types given herein may be inverted to form, instead of an NPN power transistor, a PNP power transistor.

Further, although the structure of a bipolar transistor has been described herein, it should be noted that, by forming an insulated gate at the surface of strip 37, a MOS controlled bidirectional transistor may also be formed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A bidirectional power transistor formed horizontally in a semiconductor layer disposed on a heavily-doped semiconductor wafer with an interposed insulating layer, the wafer being capable of being biased to a reference voltage, the product of the average dopant concentration and of the thickness of the semiconductor layer ranging between $5 \cdot 10^{11}$ cm$^{-2}$ and $5 \cdot 10^{12}$ cm$^{-2}$, said transistor further comprising, in the semiconductor layer, a lightly-doped semiconductor strip of a first conductivity type, at a doping level smaller than $5 \cdot 10^{15}$ at./cm$^3$; and two doped regions of a second conductivity type at a doping level ranging between $10^{15}$ and $8 \cdot 10^{17}$ at./cm$^3$, located symmetrically with respect to the semiconductor strip.

2. The transistor of claim 1, wherein said product ranges between $9 \cdot 10^{11}$ and $2 \cdot 10^{12}$ cm$^{-2}$.

3. The transistor of claim 1, wherein the doping level of each of the doped regions of the second conductivity type increases from the semiconductor strip.

4. The transistor of claim 3, wherein the doping of said regions varies gradually within a range having its lower limit between $10^{15}$ and $5 \cdot 10^{15}$ at./cm$^3$ and having its upper limit between $5 \cdot 10^{16}$ and $8 \cdot 10^{17}$ at./cm$^3$.

5. The transistor of claim 1, further comprising heavily-doped fingers of the first conductivity type crossing the semiconductor strip and extending on either side of said strip in said regions.

6. The transistor of claim 5, wherein the semiconductor strip has a width smaller than 2 μm.

7. The transistor of claim 1, further comprising a second insulating layer formed on the semiconductor layer and topped with a second conductive layer connected to the semiconductor strip.

8. The transistor of claim 1, of interdigited type.

9. The transistor of claim 1, of bipolar type, wherein the lightly-doped strip of the first conductivity type forms a base and said regions forming emitter/collector regions.

10. The transistor of claim 1, of MOS type, wherein said regions form drain/source regions, the transistor further comprising an insulated gate formed on the lightly-doped semiconductor strip of the first conductivity type.

* * * * *